(12) United States Patent
Guo et al.

(10) Patent No.: US 11,910,638 B2
(45) Date of Patent: Feb. 20, 2024

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Tianfu Guo, Hubei (CN); Hsianglun Hsu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 829 days.

(21) Appl. No.: 16/965,372

(22) PCT Filed: Feb. 12, 2020

(86) PCT No.: PCT/CN2020/074890
§ 371 (c)(1),
(2) Date: Jul. 28, 2020

(87) PCT Pub. No.: WO2021/128540
PCT Pub. Date: Jul. 1, 2021

(65) Prior Publication Data
US 2023/0165036 A1    May 25, 2023

(30) Foreign Application Priority Data
Dec. 26, 2019 (CN) .......................... 201911367287.0

(51) Int. Cl.
*H10K 50/844* (2023.01)
*H10K 71/00* (2023.01)
*H10K 50/842* (2023.01)

(52) U.S. Cl.
CPC ....... *H10K 50/844* (2023.02); *H10K 50/8426* (2023.02); *H10K 71/00* (2023.02)

(58) Field of Classification Search
None
See application file for complete search history.

(56) References Cited

U.S. PATENT DOCUMENTS

| 2019/0058156 A1 | 2/2019 | Sun et al. |
| 2019/0067627 A1 | 2/2019 | Jia et al. |
| 2019/0131351 A1 | 5/2019 | Park et al. |

(Continued)

FOREIGN PATENT DOCUMENTS

| CN | 105810715 A |   | 7/2016 |
| CN | 106450026 A | * | 2/2017 |
| CN | 106450035 A |   | 2/2017 |

(Continued)

*Primary Examiner* — Michael Lebentritt
(74) *Attorney, Agent, or Firm* — PV IP PC; Wei Te Chung; Zhigang Ma

(57) ABSTRACT

A display panel and a manufacturing method thereof are provided. The display panel includes an array substrate, a light emitting device layer, and an encapsulation layer. The encapsulation layer includes at least one first adhesive layer, and an orthographic projection of the at least one first adhesive layer on the array substrate is positioned in the array substrate.

20 Claims, 7 Drawing Sheets

(56) References Cited

U.S. PATENT DOCUMENTS

2019/0296260 A1\* 9/2019 Li ................... H10K 50/8445
2019/0334123 A1 10/2019 Zhang

FOREIGN PATENT DOCUMENTS

| | | | | |
|---|---|---|---|---|
| CN | 106654052 A | | 5/2017 | |
| CN | 107482042 A | | 12/2017 | |
| CN | 107565055 A | | 1/2018 | |
| CN | 108346746 A | | 7/2018 | |
| CN | 108539044 A | | 9/2018 | |
| CN | 108899438 A | | 11/2018 | |
| CN | 108962952 A | \* | 12/2018 | ........... H01L 23/562 |
| CN | 109755410 A | \* | 5/2019 | |
| CN | 109802053 A | \* | 5/2019 | |
| CN | 111952481 A | \* | 11/2020 | ......... H01L 27/3244 |
| CN | 112714967 A | \* | 4/2021 | |
| CN | 113589567 A | \* | 11/2021 | |
| CN | 114023906 A | \* | 2/2022 | |
| CN | 115472650 A | \* | 12/2022 | |
| JP | 2021536092 A | \* | 12/2021 | |
| KR | 20090128301 A | \* | 12/2009 | |
| KR | 20100064870 A | \* | 6/2010 | |
| KR | 20150039033 A | \* | 4/2015 | |
| KR | 20160038178 A | \* | 4/2016 | |
| WO | WO-2022082984 A1 | \* | 4/2022 | ......... H01L 27/3244 |

\* cited by examiner

DISPLAY PANEL AND MANUFACTURING METHOD THEREOF

FIELD OF INVENTION

The present disclosure relates to the field of display technologies, and more particularly to a display panel and a manufacturing method thereof.

BACKGROUND OF INVENTION

In flat panel display technologies, organic light-emitting diode (OLED) displays have many advantages, such as thinness, active light emission, fast response speed, large viewing angles, wide color gamut, high brightness, and low power consumption, which has gradually become a third-generation display technology after liquid crystal displays.

In a current OLED device, an encapsulation layer is disposed on a light emitting device layer and completely covers the light emitting device layer, and is in contact with a part of an array substrate. However, due to mismatch in stress between a film layer of the encapsulation layer and a film layer of the array substrate, the encapsulation layer in this area is separated from the array substrate, water and oxygen enter the OLED device, and a display panel fails.

Therefore, a display panel is urgently needed to solve the above issues.

SUMMARY OF INVENTION

The present application provides a display panel and a manufacturing method thereof, so as to solve technical problems that an inorganic film layer in a thin film encapsulation layer of a current display panel has a large stress.

An embodiment of the present application provides a display panel, comprising: an array substrate; a light emitting device layer disposed on the array substrate; and an encapsulation layer disposed on the light emitting device layer; the encapsulation layer comprises at least one first adhesive layer, and an orthographic projection of the at least one first adhesive layer on the array substrate is positioned in the array substrate.

In the display panel according an embodiment of the present application, the encapsulation layer comprises a first inorganic layer disposed on the light emitting device layer and the array substrate; the at least one first adhesive layer is disposed between the array substrate and the first inorganic layer and between the light emitting device layer and the first inorganic layer.

In the display panel according an embodiment of the present application, the at least one first adhesive layer is disposed on a side of the encapsulation layer away from the array substrate.

In the display panel according an embodiment of the present application, the encapsulation layer comprises a first inorganic layer, a first organic layer disposed on the first inorganic layer, and a second inorganic layer disposed on the first organic layer; the at least one first adhesive layer is disposed in an inside of the encapsulation layer, and the at least one first adhesive layer extends from the inside of the encapsulation layer to an edge of the display panel.

In the display panel according an embodiment of the present application, the at least one first adhesive layer is disposed between the first inorganic layer and the first organic layer; the at least one first adhesive layer extends from a surface of the first inorganic layer to the edge of the display panel and covers an area of the array substrate not covered by the encapsulation layer.

In the display panel according an embodiment of the present application, the at least one first adhesive layer is disposed between the first organic layer and the second inorganic layer; the at least one first adhesive layer extends from a surface of the first organic layer to the edge of the display panel and covers an area of the array substrate not covered by the encapsulation layer.

In the display panel according an embodiment of the present application, the at least one first adhesive layer is disposed inside at least one of the first inorganic layer, the first organic layer, or the second inorganic layer; the at least one first adhesive layer extends from the inside of at least one of the first inorganic layer, the first organic layer, or the second inorganic layer to the edge of the display panel and covers an area of the array substrate not covered by the encapsulation layer.

In the display panel according an embodiment of the present application, the encapsulation layer further comprises at least one second adhesive layer; the at least one second adhesive layer is disposed on any film layer on the array substrate; the at least one second adhesive layer and the at least one first adhesive layer are not disposed on a same layer; the at least one second adhesive layer extends from a film layer on the array substrate toward the edge of the display panel and overlaps with the at least one first adhesive layer.

In the display panel according an embodiment of the present application, material of the at least one first adhesive layer and material of the at least one second adhesive layer comprise at least one of aluminum oxide, silicon dioxide, titanium dioxide, silicon nitride, or zirconium dioxide.

In the display panel according an embodiment of the present application, a distance between the at least one first adhesive layer and a boundary of the display panel is less than a distance between the encapsulation layer and the boundary of the display panel.

An embodiment of the present application further provides a method of manufacturing a display panel, comprising: providing an array substrate; forming a light emitting device layer on the array substrate; and forming an encapsulation layer on the light emitting device layer; a step of forming the encapsulation layer on the light emitting device layer comprises: forming at least one first adhesive layer on the light emitting device layer; an orthographic projection of the at least one first adhesive layer on the array substrate is positioned in the array substrate.

The method of manufacturing the display panel according to an embodiment of the present application, the step of forming the encapsulation layer on the light emitting device layer comprises: forming the at least one first adhesive layer on the light emitting device layer and the array substrate not covered by the light emitting device layer; forming a first inorganic layer on the at least one first adhesive layer; wherein the at least one first adhesive layer is disposed between the array substrate and the first inorganic layer and between the light emitting device layer and the first inorganic layer.

The method of manufacturing the display panel according to an embodiment of the present application, a step of forming the at least one first adhesive layer on the light emitting device layer comprises: forming the at least one first adhesive layer on the light emitting device layer; wherein the at least one first adhesive layer is disposed on a side of the encapsulation layer away from the array substrate.

The method of manufacturing the display panel according to an embodiment of the present application, the step of forming the encapsulation layer on the light emitting device layer comprises: forming a first inorganic layer on the light emitting device layer; forming a first organic layer on the first inorganic layer; forming a second inorganic layer on the first organic layer; wherein the at least one first adhesive layer is disposed in an inside of the encapsulation layer, and the at least one first adhesive layer extends from the inside of the encapsulation layer to an edge of the display panel.

The method of manufacturing the display panel according to an embodiment of the present application, the step of forming the encapsulation layer on the light emitting device layer comprises: forming the first inorganic layer on the light emitting device layer; forming the at least one first adhesive layer on the first inorganic layer; forming the first organic layer on the at least one first adhesive layer; forming the second inorganic layer on the first organic layer; wherein the at least one first adhesive layer extends from a surface of the first inorganic layer to the edge of the display panel and covers an area of the array substrate not covered by the encapsulation layer.

The method of manufacturing the display panel according to an embodiment of the present application, the step of forming the encapsulation layer on the light emitting device layer comprises: forming the first inorganic layer on the light emitting device layer; forming the first organic layer on the first inorganic layer; forming the at least one first adhesive layer on the first organic layer; forming the second inorganic layer on the at least one first adhesive layer; wherein the at least one first adhesive layer extends from a surface of the first organic layer to the edge of the display panel and covers an area of the array substrate not covered by the encapsulation layer.

The method of manufacturing the display panel according to an embodiment of the present application, a step of forming the at least one first adhesive layer on the light emitting device layer comprises: forming the at least one first adhesive layer inside at least one of the first inorganic layer, the first organic layer, or the second inorganic layer; wherein the at least one first adhesive layer extends from the inside of at least one of the first inorganic layer, the first organic layer, or the second inorganic layer to the edge of the display panel and covers an area of the array substrate not covered by the encapsulation layer.

The method of manufacturing the display panel according to an embodiment of the present application, the step of forming the encapsulation layer on the light emitting device layer comprises: forming at least one second adhesive layer on the light emitting device layer; wherein the at least one second adhesive layer is disposed on any film layer on the array substrate, the at least one second adhesive layer and the at least one first adhesive layer are not disposed on a same layer; wherein the at least one second adhesive layer extends from a film layer on the array substrate toward the edge of the display panel and overlaps with the at least one first adhesive layer.

The method of manufacturing the display panel according to an embodiment of the present application, the at least one first adhesive layer and the at least one second adhesive layer are formed by atomic layer deposition; material of the at least one first adhesive layer and material of the at least one second adhesive layer comprise at least one of aluminum oxide, silicon dioxide, titanium dioxide, silicon nitride, or zirconium dioxide.

The method of manufacturing the display panel according to an embodiment of the present application, a distance between the at least one first adhesive layer and a boundary of the display panel is less than a distance between the encapsulation layer and the boundary of the display panel.

Beneficial Effect

In embodiments of the present application, by forming at least one adhesive layer on the array substrate, adhesive force between the array substrate and the encapsulation layer is increased. This prevents the array substrate from being separated from the encapsulation layer in a non-display area, ensures packaging performance of the encapsulation layer, and improves quality of the display panel.

DETAILED DESCRIPTION OF PREFERRED EMBODIMENTS

In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

Figure 1:
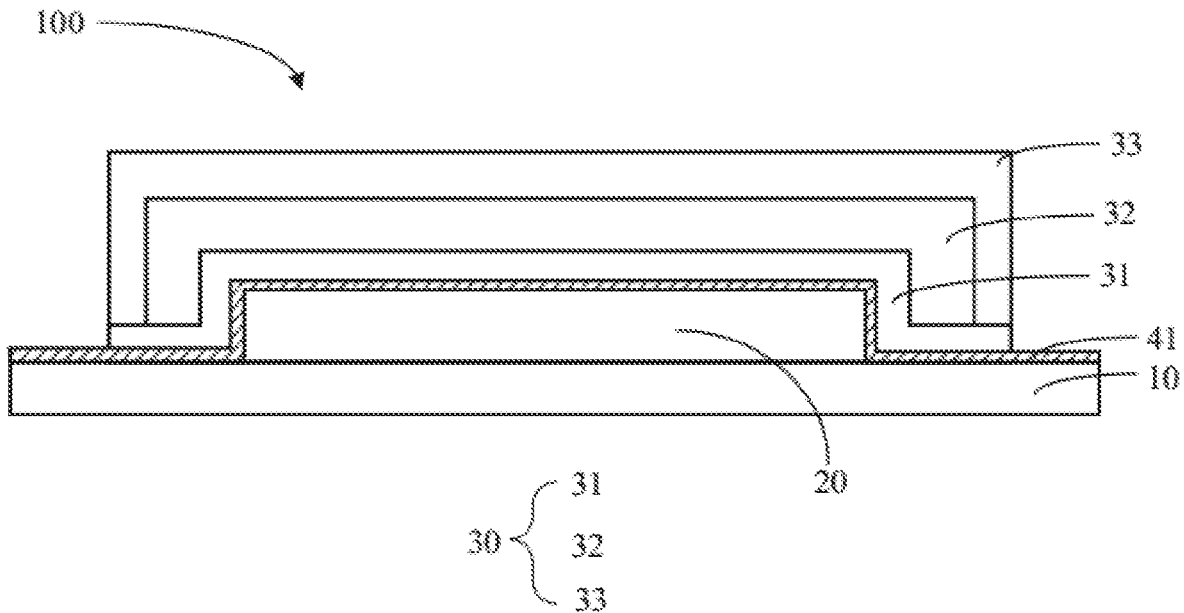
FIG. 1 is a first structural diagram of a display panel according to an embodiment of the present application.

Referring to FIG. 1, which is a first structural diagram of a display panel 100 according to an embodiment of the present application.

The display panel 100 includes an array substrate 10, a light emitting device layer 20, and an encapsulation layer 30.

The array substrate 10 includes a substrate and a thin film transistor layer disposed on the substrate.

In this embodiment, a raw material of the substrate may be one of a glass substrate, a quartz substrate, and a resin substrate. The substrate may also be a flexible substrate. Material of the flexible substrate may be PI (polyimide).

The thin film transistor layer may include a plurality of thin film transistors. The thin film transistor can be an etch stop layer type structure, a back channel etching type structure, a bottom gate thin film transistor type structure, or a top gate thin film transistor type structure, and there is no specific limitation.

The present application uses a top gate thin film transistor type structure as an example for illustration.

For example, the thin film transistor layer may include a light shielding layer, a buffer layer, an active layer, a gate insulating layer, a gate, an inter-insulating layer, source/drain, a passivation layer, and a planarization layer.

The light emitting device layer 20 is disposed on the array substrate 10.

The light emitting device layer 20 may include an anode layer, a cathode layer, and a light emitting layer disposed between the anode layer and the cathode layer. The specific structure of the light emitting device layer 20 is not discussed in detail in the present application.

The encapsulation layer 30 is disposed on the light emitting device layer 20.

The encapsulation layer 30 completely covers the light emitting device layer 20 and contacts a part of the array substrate 10.

In this embodiment, the encapsulation layer 30 may be a thin film encapsulation layer 30, which is mainly used to block water and oxygen and prevent an organic light emitting layer from being attacked by external water vapor.

The encapsulation layer 30 includes an organic layer and an inorganic layer that are disposed in a stacked manner. The organic layer is generally disposed in a middle of the encapsulation layer 30, and the inorganic layer is disposed on both sides of the encapsulation layer 30, and the organic layer is wrapped in the middle.

In this embodiment, the encapsulation layer 30 includes a first inorganic layer 31, a first organic layer 32 disposed on the first inorganic layer 31, and a second inorganic layer 33 disposed on the first organic layer 32.

In this embodiment, the first inorganic layer 31 may be prepared by, but not limited to, processes such as CVD and PVD. Material of the first inorganic layer 31 may include at least one of inorganic compounds such as silicon nitride, silicon oxynitride, silicon nitride carbide, and silicon oxide.

In this embodiment, the first inorganic layer 31 may be provided by stacking a plurality of inorganic film layers. Materials of the inorganic film layers provided in a stack may be the same or different.

In this embodiment, the first organic layer 32 may be, but is not limited to, prepared by a manufacturing process such as IJP, CVD, or evaporation. The material of the first organic layer 32 may include at least one of HMDSO, alucone, epoxy resin, acrylic system, or an organic compound containing silicon. The first organic layer 32 is mainly used to include foreign matters in the manufacturing process and release stress generated by the inorganic layer, so as to improve flexibility of the encapsulation layer 30.

In this embodiment, the second inorganic layer 33 may be, but is not limited to, prepared by processes such as CVD and PVD. The material of the second inorganic layer 33 may include at least one of inorganic compounds such as silicon nitride, silicon oxynitride, silicon nitride carbide, and silicon oxide.

In this embodiment, a thickness of the second inorganic layer 33 is less than 2 micrometers.

In this embodiment, the second inorganic layer 33 may be provided by stacking a plurality of inorganic film layers. Materials of the inorganic film layers provided in a stack may be the same or different.

In this embodiment, a distance between the first inorganic layer 31 and a boundary of the display panel 100 may be equal to or less than a distance between the second inorganic layer 33 and the boundary of the display panel 100. A distance between the first inorganic layer 31 or the second inorganic layer 33 and the boundary of the display panel 100 is greater than a distance between the first organic layer 32 and a boundary of the display panel 100.

Referring to FIG. 1, the display panel 100 further includes at least one first adhesive layer 41 disposed in the encapsulation layer 30. An orthographic projection of the at least one first adhesive layer 41 on the array substrate 10 is positioned in the array substrate 10.

In this embodiment, the at least one first adhesive layer 41 is formed by an atomic deposition (ALD) process.

Atomic layer deposition technology is a thin film deposition technology based on surface chemical vapor reaction. It introduces two or more chemical gas precursors into a reaction chamber separately. This allows each precursor to undergo a fully saturated surface chemical reaction on a base surface. Purge gas phase reaction products and unreacted gases after the saturated surface reaction. Therefore, substance can be plated on a surface of the substrate in the form of a single atom film, and thickness and uniformity of the deposited film can be accurately controlled within a thickness of the atomic layer.

Referring to FIG. 1, the at least one first adhesive layer 41 may be disposed between the array substrate 10 and the first inorganic layer 31 and between the light emitting device layer 20 and the first inorganic layer 31.

In an embodiment, a thickness of the first adhesive layer 41 is not less than 100 nm.

In an embodiment, material of the first adhesive layer 41 may include at least one of inorganic compounds such as aluminum oxide, silicon dioxide, titanium dioxide, silicon nitride, and zirconium dioxide.

Because the first adhesive layer 41 is a single-atom thin film, the first adhesive layer 41 is used as a medium in this embodiment. This increases adhesion between the encapsulation layer 30 and the light emitting device layer 20 on both sides of the first adhesive layer 41 and adhesion between the encapsulation layer 30 and the array substrate 10. The peeling of the encapsulation layer 30 is avoided.

In addition, because the first inorganic layer 31 in the encapsulation layer 30 is in contact with the cathode layer in the light emitting device layer 20, surface roughness of a metal layer is relatively large, and there may be a certain raised foreign matter. A thickness of the first inorganic layer 31 is relatively thin, and it is easy to be pierced by the raised metallic foreign matter, thereby reducing water and oxygen blocking performance of the encapsulation layer 30.

The presence of the first adhesive layer 41 can wrap the raised metallic foreign matter. This prevents water and oxygen in the air from entering the light emitting device layer 20 from a front side, and further ensures performance of the encapsulation layer 30.

Figure 2:
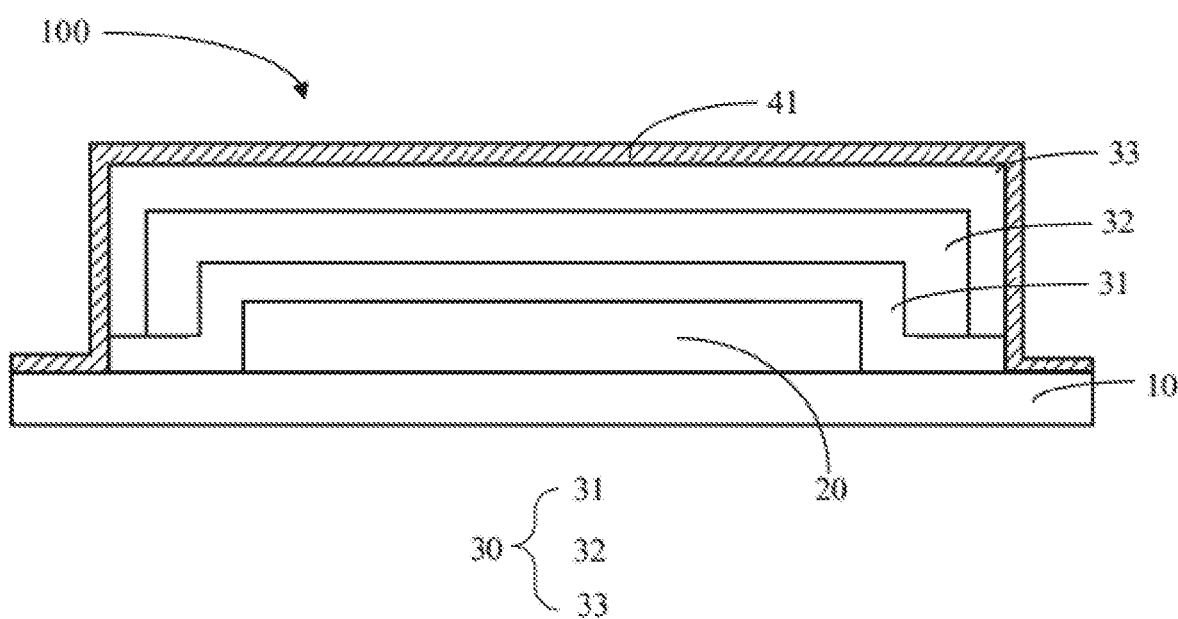
FIG. 2 is a second structural diagram of a display panel according to an embodiment of the present application.

Referring to FIG. 2, which is a second structural diagram of the display panel 100 according to an embodiment of the present application.

The first adhesive layer 41 is disposed on a side of the encapsulation layer 30 away from the array substrate 10.

The first adhesive layer 41 completely covers the encapsulation layer 30 and extends to a non-display area of the display panel 100, and covers the array substrate 10 in the non-display area.

The existence of the first adhesive layer 41 prevents the encapsulation layer 30 from peeling away from the array substrate 10 in the non-display area.

In this embodiment, the first adhesive layer 41 may also be located in the encapsulation layer 30. The first adhesive layer is located in the encapsulation layer, and the first adhesive layer extends from the encapsulation layer to an edge of the display panel.

Figure 3:
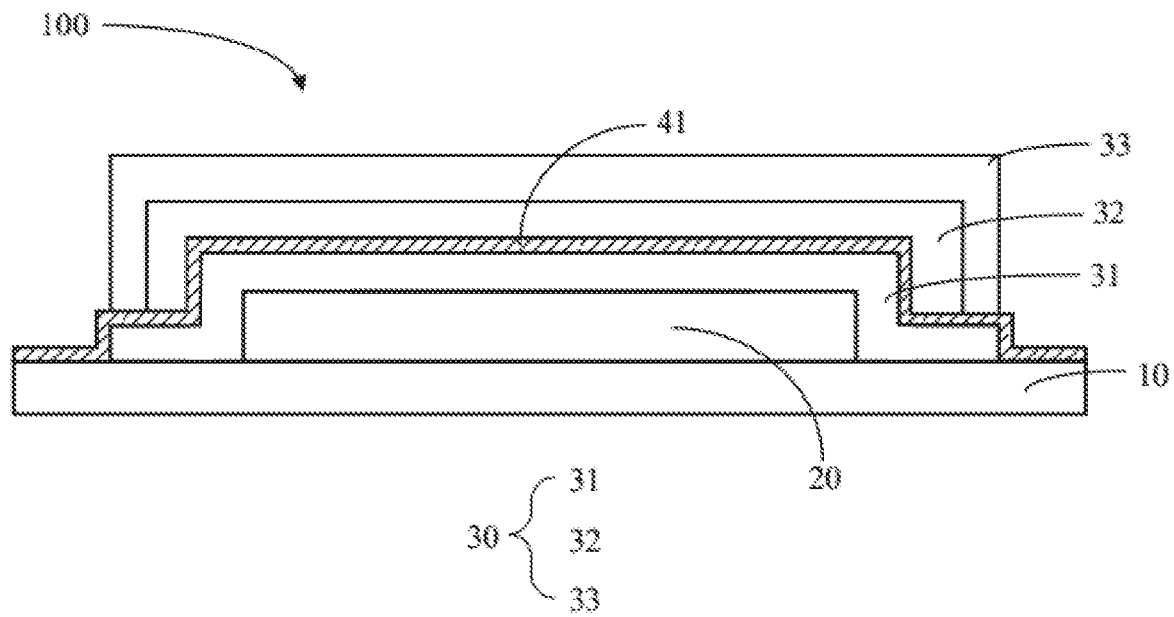
FIG. 3 is a third structural diagram of a display panel according to an embodiment of the present application.

Referring to FIG. 3, which is a third structural diagram of the display panel 100 of the present application.

The first adhesive layer 41 may be located between the first inorganic layer 31 and the first organic layer 32. The first adhesive layer 41 extends from a surface of the first inorganic layer 31 to an edge of the display panel 100 and covers an area of the array substrate 10 that is not covered by the encapsulation layer 30.

Figure 4:
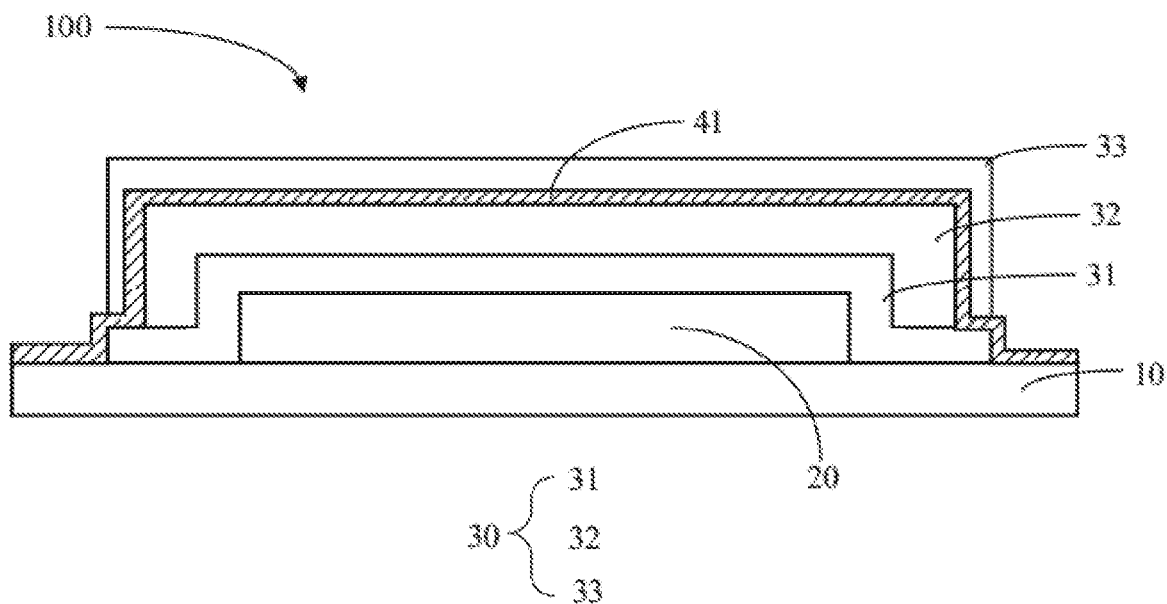
FIG. 4 is a fourth structural diagram of a display panel according to an embodiment of the present application.

Referring to FIG. 4, which is a fourth structural diagram of the display panel 100 of the present application.

The first adhesive layer 41 may be located between the first organic layer 32 and the second inorganic layer 33. The first adhesive layer 41 extends from a surface of the first organic layer 32 to an edge of the display panel 100 and covers an area of the array substrate 10 that is not covered by the encapsulation layer 30.

In this embodiment, at least one of the first inorganic layer 31, the first organic layer 32, or the second inorganic layer 33 is provided with at least one of the first adhesive layer 41. The first adhesive layer 41 extends from an inside of at least one of the first inorganic layer 31, the first organic layer 32, or the second inorganic layer 33 to an edge of the display panel 100, and covers an area of the array substrate 10 that is not covered by the encapsulation layer 30.

One of these structures will be described below.

Figure 5:
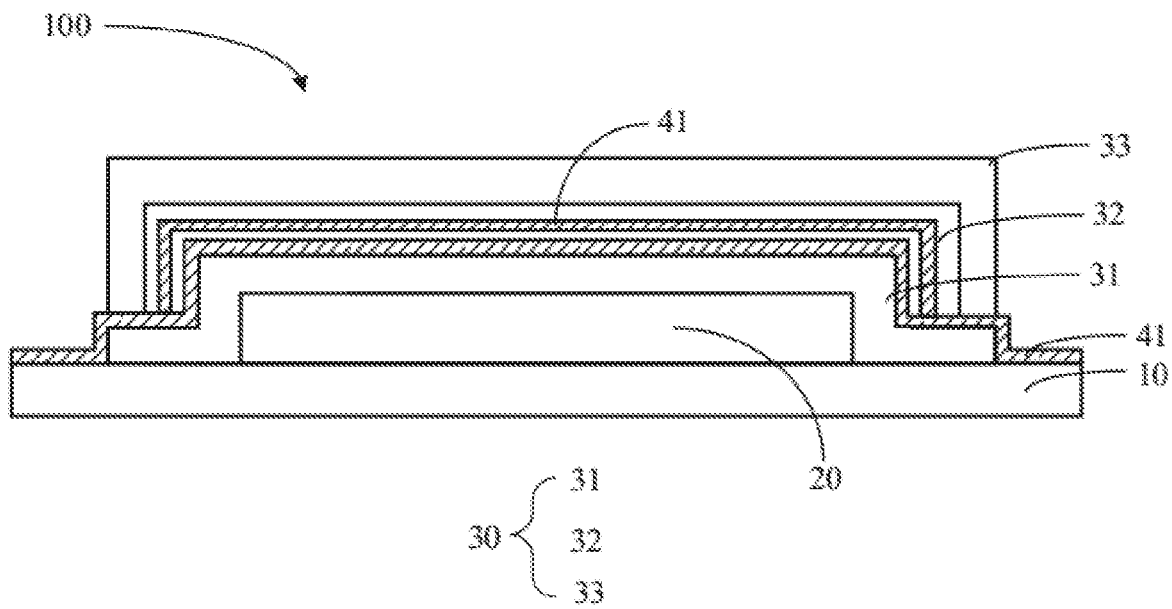
FIG. 5 is a fifth structural diagram of a display panel according to an embodiment of the present application.

Referring to FIG. 5, which is a fifth structural diagram of the display panel 100 of the present application.

The first organic layer 32 is provided with two layers of the first adhesive layers 41.

The encapsulation layer 30 may further include at least one second adhesive layer 42.

In this embodiment, the second adhesive layer 42 is located on any film layer on the array substrate 10. The second adhesive layer 42 extends from a film layer on the array substrate 10 toward an edge of the display panel 100 and overlaps the first adhesive layer 41.

In this embodiment, the second adhesive layer 42 and the first adhesive layer 41 are disposed on different layers. The second adhesive layer 42 is formed by an atomic deposition process.

In this embodiment, a thickness of the second adhesive layer 42 is not less than 100 nm.

In this embodiment, material of the second adhesive layer 42 may include at least one of inorganic compounds such as aluminum oxide, silicon dioxide, titanium dioxide, silicon nitride, and zirconia.

Figure 6:
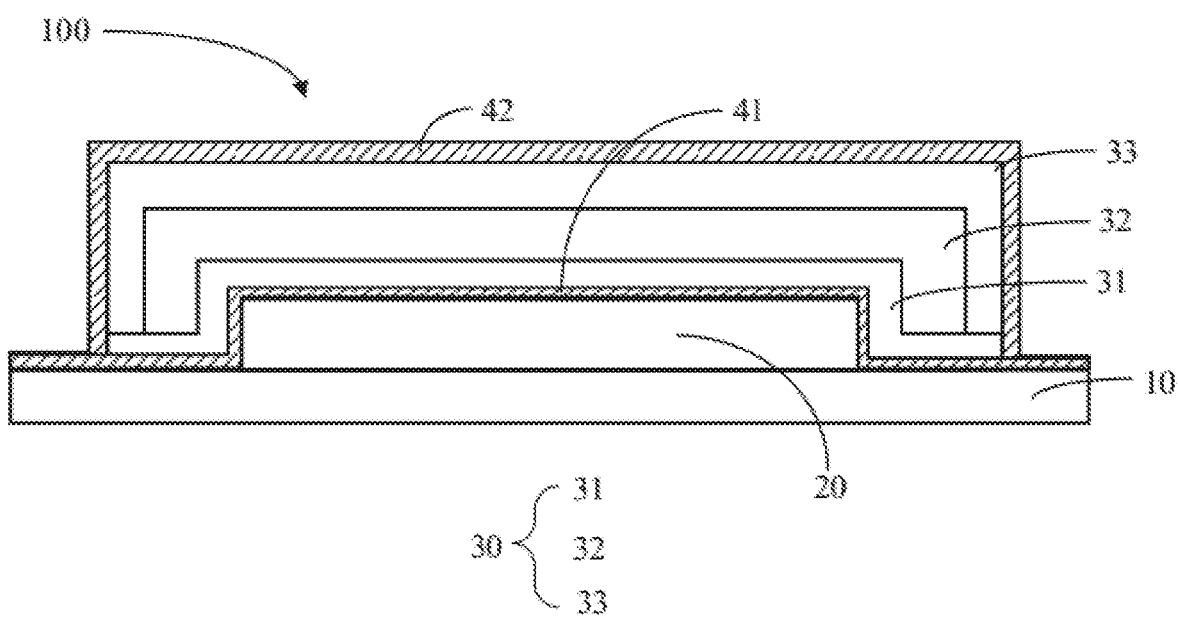
FIG. 6 is a sixth structural diagram of a display panel according to an embodiment of the present application.

Referring to FIG. 6, which is a sixth structural diagram of the display panel 100 of the present application.

The first adhesive layer 41 may be located between the array substrate 10 and the encapsulation layer 30 and between the light emitting device layer 20 and the encapsulation layer 30, and the second adhesive layer 42 is located on a side of the encapsulation layer 30 away from the array substrate 10.

It can be seen from FIG. 6 that FIG. 6 is a combination of FIG. 1 and FIG. 2 of the present application.

The second adhesive layer 42 may be any of the cases in FIGS. 1 to 5, as long as the first adhesive layer 41 and the second adhesive layer 42 are not disposed on the same layer in a display area.

In this embodiment, a distance between the first adhesive layer 41 and a boundary of the display panel 100 is smaller than a distance between the encapsulation layer 30 and the boundary of the display panel 100.

In this embodiment, a distance between the first adhesive layer 41 and the boundary of the display panel 100 may be equal to a distance between the array substrate 10 and the boundary of the display panel 100.

In FIGS. 1 to 6 of the present application, the present application forms at least one adhesive layer on the array substrate, and the adhesive layer extends from the encapsulation layer 30 to the edge of the display panel 100 to cover an area of the array substrate 10 that is not covered by the encapsulation layer 30. This further prevents water or oxygen from attacking the metal or organic film layer in the array substrate 10.

In the present application, at least one adhesive layer is formed on the array substrate 10. This increases adhesion between the array substrate 10 and the encapsulation layer 30. This prevents the array substrate 10 from being separated from the encapsulation layer 30 in the non-display area, ensures packaging performance of the encapsulation layer 30, and improves quality of the display panel 100.

Figure 7:
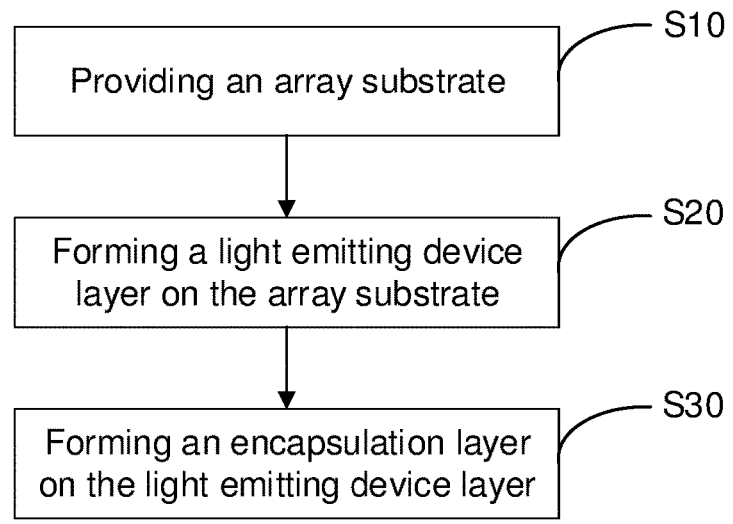
FIG. 7 is a step diagram of a manufacturing method of a display panel according to an embodiment of the present application.

Referring to FIG. 7, which is a flowchart of a method of manufacturing the display panel 100 of the present application.

Referring to FIGS. 8A to 8H. FIGS. 8A to 8H are process flow diagrams of a method of manufacturing the display panel 100 of the present application.

The manufacturing method of the display panel 100 includes:

S10, providing an array substrate 10.

Figure 8A:
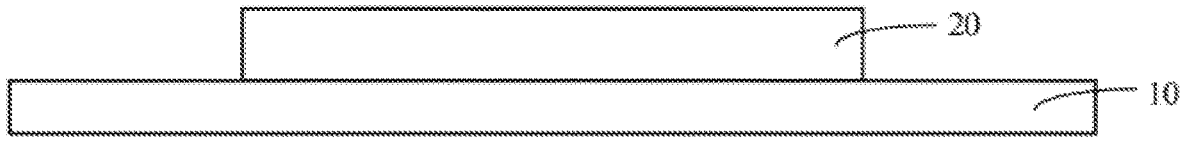
FIG. 8A to FIG. 8H are process flow diagrams of a method of manufacturing a display panel according to an embodiment of the present application.

Referring to FIG. 8A, the array substrate 10 includes a substrate and a thin film transistor layer disposed on the substrate.

In this embodiment, a raw material of the substrate may be one of a glass substrate, a quartz substrate, and a resin substrate. The substrate may also be a flexible substrate. Material of the flexible substrate may be PI (polyimide).

The thin film transistor layer may include a plurality of thin film transistors. The thin film transistor can be an etch stop layer type structure, a back channel etching type structure, a bottom gate thin film transistor type structure, or a top gate thin film transistor type structure, and there is no specific limitation.

For example, the thin film transistor layer may include a light shielding layer, a buffer layer, an active layer, a gate insulating layer, a gate, an inter-insulating layer, source/drain, a passivation layer, and a planarization layer.

S20, forming a light emitting device layer 20 on the array substrate 10.

Referring to FIG. 8A, the light emitting device layer 20 may include an anode layer, a cathode layer, and a light emitting layer disposed between the anode layer and the cathode layer. The specific structure of the light emitting device layer 20 is not discussed in detail in the present application.

S30, forming an encapsulation layer 30 on the light emitting device layer 20.

Figure 8B:
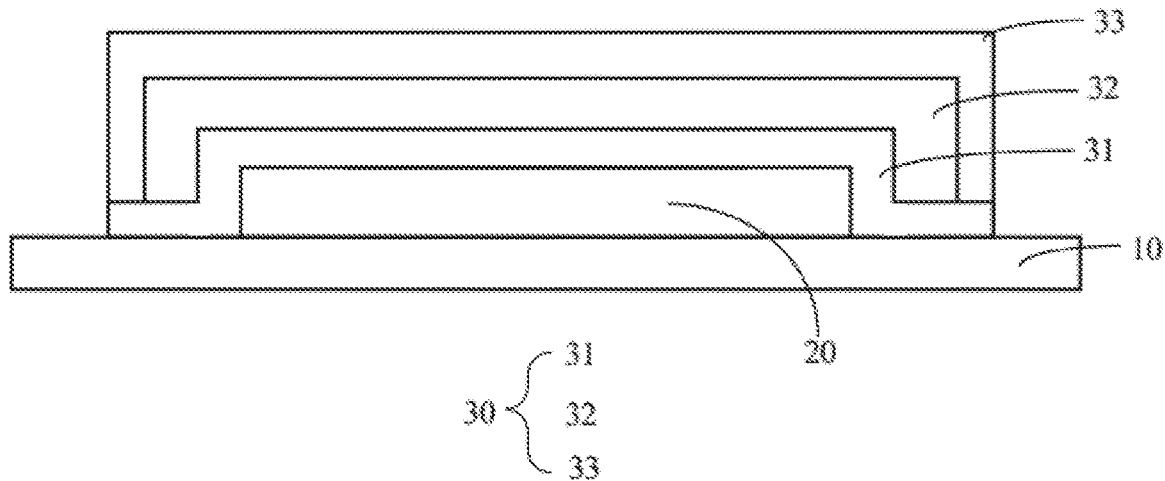

Referring to FIG. 8B, the encapsulation layer 30 completely covers the light emitting device layer 20 and contacts a part of the array substrate 10.

In this embodiment, the encapsulation layer 30 may be a thin film encapsulation layer 30, which is mainly used to block water and oxygen and prevent an organic light emitting layer from being attacked by external water vapor.

The encapsulation layer 30 includes an organic layer and an inorganic layer that are disposed in a stacked manner. The organic layer is generally disposed in a middle of the encapsulation layer 30, and the inorganic layer is disposed on both sides of the encapsulation layer 30, and the organic layer is wrapped in the middle.

Step S30 may include:

S301, forming a first inorganic layer 31 on the light emitting device layer 20.

In this embodiment, the first inorganic layer 31 may be prepared by, but not limited to, processes such as CVD and PVD. Material of the first inorganic layer 31 may include at least one of inorganic compounds such as silicon nitride, silicon oxynitride, silicon nitride carbide, and silicon oxide.

In this embodiment, the first inorganic layer 31 may be provided by stacking a plurality of inorganic film layers. Materials of the inorganic film layers provided in a stack may be the same or different.

S302, forming a first organic layer 32 on the first inorganic layer 31.

In this embodiment, the first organic layer 32 may be, but is not limited to, prepared by a manufacturing process such as IJP, CVD, or evaporation. The material of the first organic layer 32 may include at least one of HMDSO, alucone, epoxy resin, acrylic system, or an organic compound containing silicon. The first organic layer 32 is mainly used to include foreign matters in the manufacturing process and release stress generated by the inorganic layer, so as to improve flexibility of the encapsulation layer 30.

S303, forming a second inorganic layer 33 on the first organic layer 32.

In this embodiment, the second inorganic layer 33 may be, but not limited to, prepared by processes such as CVD and PVD. The material of the second inorganic layer 33 may include at least one of inorganic compounds such as silicon nitride, silicon oxynitride, silicon nitride carbide, and silicon oxide.

In this embodiment, a thickness of the second inorganic layer 33 is less than 2 micrometers.

In this embodiment, the second inorganic layer 33 may be provided by stacking a plurality of inorganic film layers. Materials of the inorganic film layers provided in a stack may be the same or different.

In this embodiment, a distance between the first inorganic layer 31 and a boundary of the display panel 100 may be equal to or less than a distance between the second inorganic layer 33 and the boundary of the display panel 100. A distance between the first inorganic layer 31 or the second inorganic layer 33 and the boundary of the display panel 100 is greater than a distance between the first organic layer 32 and a boundary of the display panel 100.

The manufacturing method of the display panel 100 further includes steps:

S40, forming at least one first adhesive layer 41 on the light emitting device layer 20.

In an embodiment, an orthographic projection of the at least one first adhesive layer 41 on the array substrate 10 is positioned in the array substrate 10.

In this embodiment, the at least one first adhesive layer 41 is formed by an atomic deposition (ALD) process.

Figure 8C:
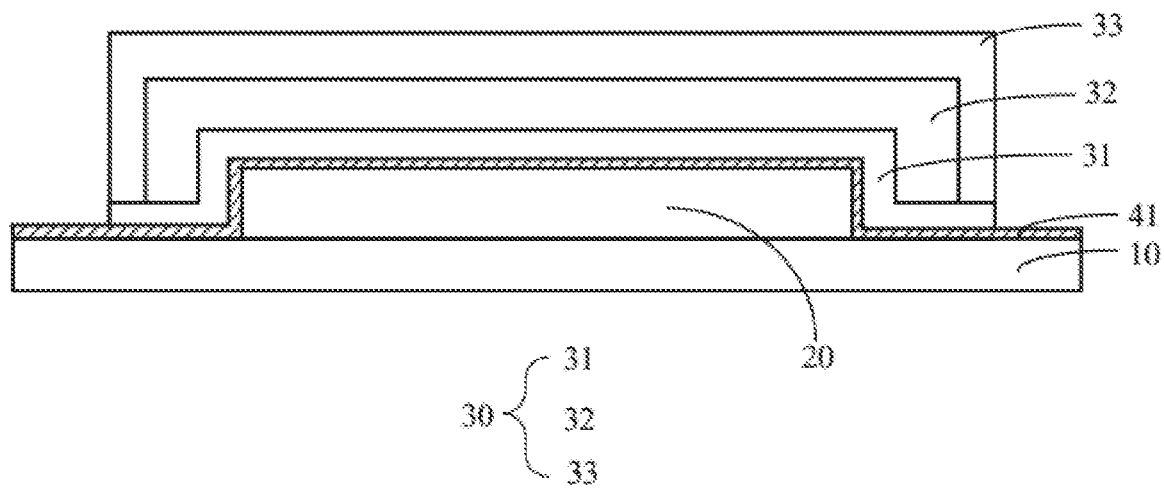

Referring to FIG. 8C, step S40 may include:

Forming at least one first adhesive layer 41 on the light emitting device layer 20 and the array substrate 10 not covered by the light emitting device, so that the first adhesive layer 41 is located between the array substrate 10 and the encapsulation layer 30 and between the light emitting device layer 20 and the encapsulation layer 30.

In an embodiment, a thickness of the first adhesive layer 41 is not less than 100 nm.

In an embodiment, material of the first adhesive layer 41 may include at least one of inorganic compounds such as aluminum oxide, silicon dioxide, titanium dioxide, silicon nitride, and zirconium dioxide.

Because the first adhesive layer 41 is a single-atom thin film, the first adhesive layer 41 is used as a medium in this embodiment. This increases adhesion between the encapsulation layer 30 and the light emitting device layer 20 on both sides of the first adhesive layer 41 and adhesion between the encapsulation layer 30 and the array substrate 10. The peeling of the encapsulation layer 30 is avoided.

In addition, because the first inorganic layer 31 in the encapsulation layer 30 is in contact with the cathode layer in the light emitting device layer 20, surface roughness of a metal layer is relatively large, and there may be a certain raised foreign matter. A thickness of the first inorganic layer 31 is relatively thin, and it is easy to be pierced by the raised metallic foreign matter, thereby reducing water and oxygen blocking performance of the encapsulation layer 30.

The presence of the first adhesive layer 41 can wrap the raised metallic foreign matter. This prevents water and oxygen in the air from entering the light emitting device layer 20 from a front side, and further ensures performance of the encapsulation layer 30.

Figure 8D:
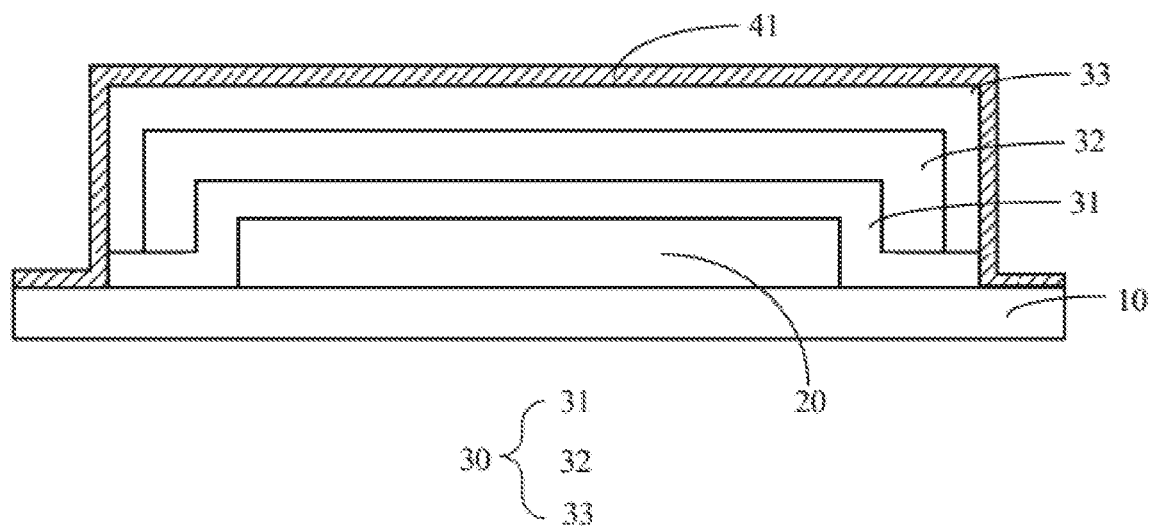

Referring to FIG. 8D, Step S40 may include:

Forming the at least one first adhesive layer 41 on the encapsulation layer.

In an embodiment, the first adhesive layer 41 is disposed on a side of the encapsulation layer 30 away from the array substrate 10.

The first adhesive layer 41 completely covers the encapsulation layer 30 and extends to a non-display area of the display panel 100, and covers the array substrate 10 in the non-display area.

The existence of the first adhesive layer 41 prevents the encapsulation layer 30 from peeling away from the array substrate 10 in the non-display area.

In this embodiment, the first adhesive layer 41 may also be located in the encapsulation layer 30. The first adhesive layer is located in the encapsulation layer, and the first adhesive layer extends from the encapsulation layer to an edge of the display panel.

Figure 8E:
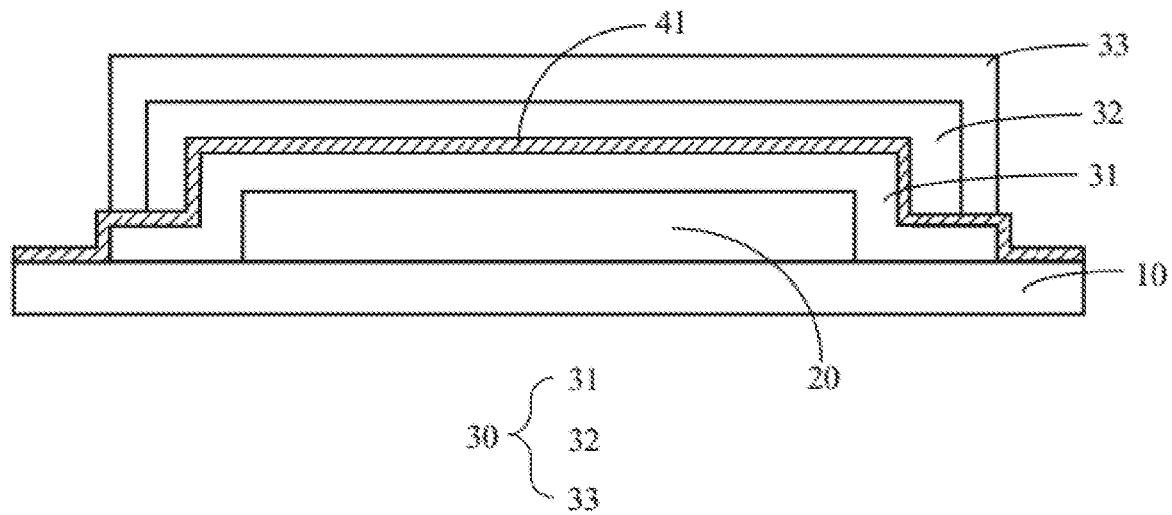

Referring to FIG. 8E, step S30 may include:

S311, forming the first inorganic layer 31 on the light emitting device layer 20.

S312, forming the first adhesive layer 41 on the first inorganic layer 31.

S313, forming the first organic layer 32 on the first adhesive layer 41.

S314, forming the second inorganic layer 33 on the first organic layer 32.

The first adhesive layer 41 extends from a surface of the first inorganic layer 31 to an edge of the display panel 100 and covers an area of the array substrate 10 that is not covered by the encapsulation layer 30.

Figure 8F:
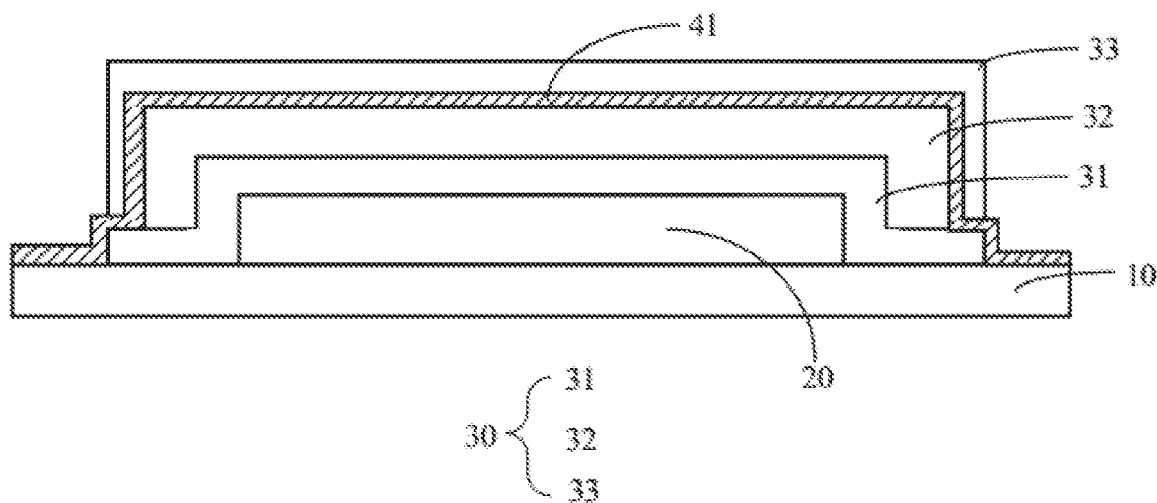

Referring to FIG. 8F, step S30 may include:

S321, forming the first inorganic layer 31 on the light emitting device layer 20.

S322, forming the first organic layer 32 on the first inorganic layer 31.

S323, forming the first adhesive layer 41 on the first organic layer 32.

S324, forming the second inorganic layer 33 on the first adhesive layer 41.

The first adhesive layer 41 extends from a surface of the first organic layer 32 to an edge of the display panel 100 and covers an area of the array substrate 10 that is not covered by the encapsulation layer 30.

Figure 8G:
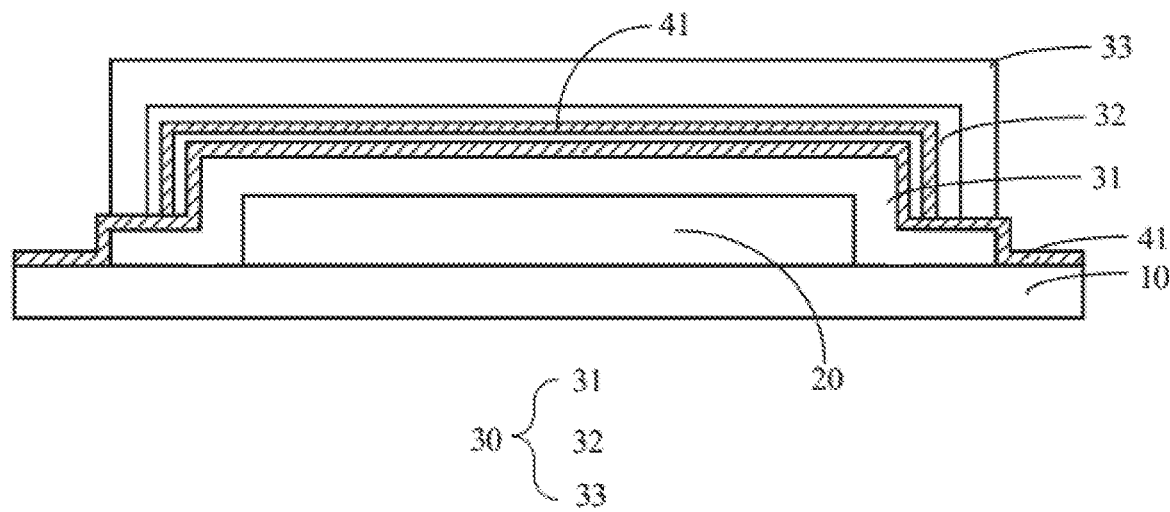

Referring to FIG. 8G, step S40 may further include:

Forming the at least one first adhesive layer 41 inside at least one of the first inorganic layer 31, the first organic layer 32, or the second inorganic layer 33.

The first adhesive layer 41 extends from an inside of at least one of the first inorganic layer 31, the first organic layer 32, or the second inorganic layer 33 to an edge of the display panel 100, and covers an area of the array substrate 10 that is not covered by the encapsulation layer 30.

In an embodiment, the first organic layer 32 is provided with two layers of the first adhesive layers 41.

The manufacturing method of the display panel 100 further includes steps:

S50, forming at least one second adhesive layer on the light emitting device layer 20.

In this embodiment, the second adhesive layer 42 is located on any film layer on the array substrate 10. The second adhesive layer 42 extends from a film layer on the array substrate 10 toward an edge of the display panel 100 and overlaps the first adhesive layer 41.

Figure 8H:
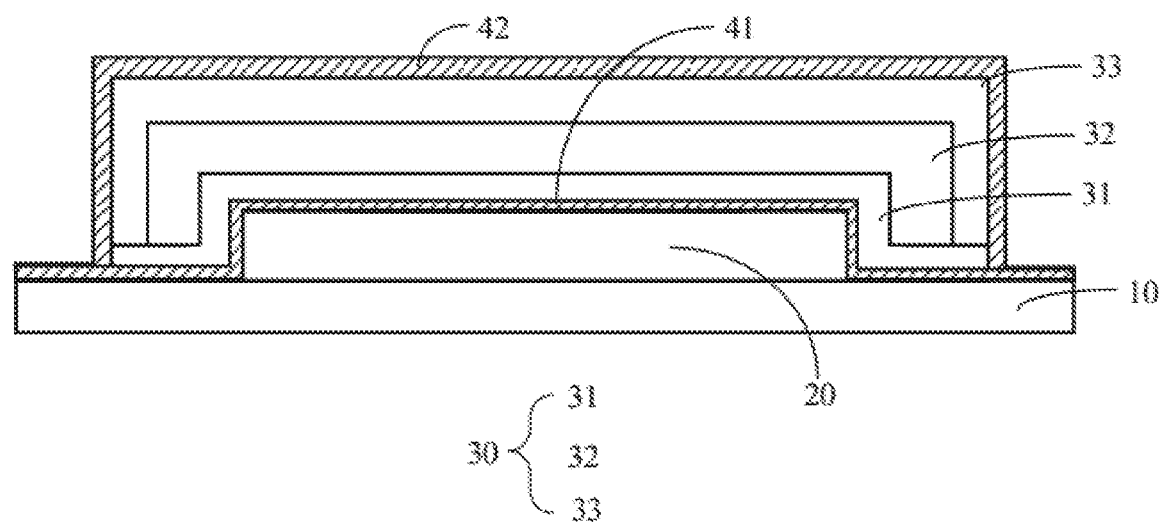

Referring to FIG. 8H, the first adhesive layer 41 may be located between the array substrate 10 and the encapsulation layer 30 and between the light emitting device layer 20 and the encapsulation layer 30, and the second adhesive layer 42 is located on a side of the encapsulation layer 30 away from the array substrate 10.

It can be seen from FIG. 8H that FIG. 8H is a combination of FIG. 8C and FIG. 8D of the present application.

The second adhesive layer 42 may be in any of the cases shown in FIGS. 8C to 8G, as long as the first adhesive layer 41 and the second adhesive layer 42 are not disposed on the same layer in the display area.

In an embodiment, the second adhesive layer 42 may be formed by an atomic layer deposition process.

In an embodiment, material of the second adhesive layer 42 may include at least one of alumina, silicon dioxide, titanium dioxide, silicon nitride, zirconia, and the like.

In an embodiment, a distance between the first adhesive layer 41 and a boundary of the display panel 100 is smaller than a distance between the encapsulation layer 30 and the boundary of the display panel 100.

In an embodiment, a distance between the first adhesive layer 41 and the boundary of the display panel 100 may be equal to a distance between the array substrate 10 and the boundary of the display panel 100.

In above embodiments of the present application, the present application forms at least one adhesive layer on the array substrate, and the adhesive layer extends from the encapsulation layer 30 to the edge of the display panel 100 to cover an area of the array substrate 10 that is not covered by the encapsulation layer 30. This further prevents water or oxygen from attacking the metal or organic film layer in the array substrate 10.

According to another aspect of the present application, a display module is further provided. The display module includes the display panel, and further includes a touch layer, a polarizing layer, and a cover layer disposed on the display panel in order. The encapsulation layer is bonded to the touch layer through a first optical adhesive layer, and the polarizing layer is bonded to the cover layer through a second optical adhesive layer.

According to yet another aspect of the present application, an electronic device is further provided. The electronic device includes the display module. The electronic device includes, but is not limited to, a mobile phone, a tablet computer, a computer monitor, a game console, a television, a display screen, a wearable device, and other home device or household appliance with display functions.

The working principle of the display module and the working principle of the electronic device are similar to the working principle of the display panel. The working principle of the display module and the working principle of the electronic device can be referred to the display panel. The working principle is not repeated here.

Embodiments of the present application provide a display panel and a manufacturing method thereof. The display panel includes an array substrate, a light emitting device layer, an encapsulation layer, and at least one first adhesive layer disposed on the array substrate, and an orthographic projection of the at least one first adhesive layer on the array substrate is positioned in the array substrate. In the present application, at least one adhesive layer is formed on the array substrate. This increases adhesion between the array substrate and the encapsulation layer. This prevents the array substrate from being separated from the encapsulation layer in the non-display area, ensures packaging performance of the encapsulation layer 30, and improves quality of the display panel.

It can be understood that, for a person of ordinary skill in the art, equivalent replacements or changes may be made according to the technical solution and the inventive concept of the present application. All these changes or replacements should fall within the protection scope of the claims attached to the present application.

What is claimed is:

1. A display panel, comprising:
an array substrate;
a light emitting device layer disposed on the array substrate; and
an encapsulation layer disposed on the light emitting device layer;
wherein the encapsulation layer comprises at least one first adhesive layer, and an orthographic projection of the at least one first adhesive layer on the array substrate is positioned in the array substrate;
wherein the at least one first adhesive layer is disposed between the first inorganic layer and the first organic layer;
wherein the at least one first adhesive layer extends from a surface of the first inorganic layer to the edge of the display panel and covers an area of the array substrate not covered by the encapsulation layer.

2. The display panel according to claim 1, wherein the encapsulation layer comprises a first inorganic layer disposed on the light emitting device layer and the array substrate;
the at least one first adhesive layer is disposed between the array substrate and the first inorganic layer and between the light emitting device layer and the first inorganic layer.

3. The display panel according to claim 1, wherein:
the at least one first adhesive layer is disposed on a side of the encapsulation layer away from the array substrate.

4. The display panel according to claim 1, wherein:
the encapsulation layer comprises a first inorganic layer, a first organic layer disposed on the first inorganic layer, and a second inorganic layer disposed on the first organic layer;
wherein the at least one first adhesive layer is disposed in an inside of the encapsulation layer, and the at least one first adhesive layer extends from the inside of the encapsulation layer to an edge of the display panel.

5. The display panel according to claim 4, wherein:
the at least one first adhesive layer is disposed inside at least one of the first inorganic layer, the first organic layer, or the second inorganic layer;
the at least one first adhesive layer extends from the inside of at least one of the first inorganic layer, the first organic layer, or the second inorganic layer to the edge of the display panel and covers an area of the array substrate not covered by the encapsulation layer.

6. The display panel according to claim 1, wherein:
the encapsulation layer further comprises at least one second adhesive layer;
the at least one second adhesive layer is disposed on any film layer on the array substrate;
the at least one second adhesive layer and the at least one first adhesive layer are not disposed on a same layer;
the at least one second adhesive layer extends from a film layer on the array substrate toward the edge of the display panel and overlaps with the at least one first adhesive layer.

7. The display panel according to claim 6, wherein:
material of the at least one first adhesive layer and material of the at least one second adhesive layer comprise at least one of aluminum oxide, silicon dioxide, titanium dioxide, silicon nitride, or zirconium dioxide.

8. The display panel according to claim 1, wherein:
a distance between the at least one first adhesive layer and a boundary of the display panel is less than a distance between the encapsulation layer and the boundary of the display panel.

9. A method of manufacturing a display panel, comprising:
providing an array substrate;
forming a light emitting device layer on the array substrate; and
forming an encapsulation layer on the light emitting device layer;
wherein a step of forming the encapsulation layer on the light emitting device layer comprises:
forming at least one first adhesive layer on the light emitting device layer;
wherein an orthographic projection of the at least one first adhesive layer on the array substrate is positioned in the array substrate;
wherein the step of forming the encapsulation layer on the light emitting device layer comprises:
forming the first inorganic layer on the light emitting device layer;
forming the at least one first adhesive layer on the first inorganic layer;
forming the first organic layer on the at least one first adhesive layer;
forming the second inorganic layer on the first organic layer;
wherein the at least one first adhesive layer extends from a surface of the first inorganic layer to the edge of the display panel and covers an area of the array substrate not covered by the encapsulation layer.

10. The method of manufacturing the display panel according to claim 9, wherein the step of forming the encapsulation layer on the light emitting device layer comprises:
forming the at least one first adhesive layer on the light emitting device layer and the array substrate not covered by the light emitting device layer;
forming a first inorganic layer on the at least one first adhesive layer;
wherein the at least one first adhesive layer is disposed between the array substrate and the first inorganic layer and between the light emitting device layer and the first inorganic layer.

11. The method of manufacturing the display panel according to claim 9, wherein a step of forming the at least one first adhesive layer on the light emitting device layer comprises:
forming the at least one first adhesive layer on the light emitting device layer;
wherein the at least one first adhesive layer is disposed on a side of the encapsulation layer away from the array substrate.

12. The method of manufacturing the display panel according to claim 9, wherein the step of forming the encapsulation layer on the light emitting device layer comprises:
forming a first inorganic layer on the light emitting device layer;
forming a first organic layer on the first inorganic layer;
forming a second inorganic layer on the first organic layer;
wherein the at least one first adhesive layer is disposed in an inside of the encapsulation layer, and the at least one first adhesive layer extends from the inside of the encapsulation layer to an edge of the display panel.

13. The method of manufacturing the display panel according to claim 12, wherein a step of forming the at least one first adhesive layer on the light emitting device layer comprises:
forming the at least one first adhesive layer inside at least one of the first inorganic layer, the first organic layer, or the second inorganic layer;
wherein the at least one first adhesive layer extends from the inside of at least one of the first inorganic layer, the first organic layer, or the second inorganic layer to the edge of the display panel and covers an area of the array substrate not covered by the encapsulation layer.

14. The method of manufacturing the display panel according to claim 9, wherein the step of forming the encapsulation layer on the light emitting device layer comprises:
forming at least one second adhesive layer on the light emitting device layer;
wherein the at least one second adhesive layer is disposed on any film layer on the array substrate, the at least one second adhesive layer and the at least one first adhesive layer are not disposed on a same layer;
wherein the at least one second adhesive layer extends from a film layer on the array substrate toward the edge of the display panel and overlaps with the at least one first adhesive layer.

15. The method of manufacturing the display panel according to claim 14, wherein the at least one first adhesive layer and the at least one second adhesive layer are formed by atomic layer deposition;
material of the at least one first adhesive layer and material of the at least one second adhesive layer comprise at least one of aluminum oxide, silicon dioxide, titanium dioxide, silicon nitride, or zirconium dioxide.

16. The method of manufacturing the display panel according to claim 9, wherein a distance between the at least one first adhesive layer and a boundary of the display panel is less than a distance between the encapsulation layer and the boundary of the display panel.

17. A display panel, comprising:
an array substrate;
a light emitting device layer disposed on the array substrate; and an encapsulation layer disposed on the light emitting device layer;

wherein the encapsulation layer comprises at least one first adhesive layer, and an orthographic projection of the at least one first adhesive layer on the array substrate is positioned in the array substrate;

wherein:

the encapsulation layer further comprises at least one second adhesive layer;

the at least one second adhesive layer is disposed on any film layer on the array substrate;

the at least one second adhesive layer and the at least one first adhesive layer are not disposed on a same layer;

the at least one second adhesive layer extends from a film layer on the array substrate toward the edge of the display panel and overlaps with the at least one first adhesive layer.

18. The display panel according to claim 17, wherein:
material of the at least one first adhesive layer and material of the at least one second adhesive layer comprise at least one of aluminum oxide, silicon dioxide, titanium dioxide, silicon nitride, or zirconium dioxide.

19. The display panel according to claim 17, wherein the encapsulation layer comprises a first inorganic layer disposed on the light emitting device layer and the array substrate;
the at least one first adhesive layer is disposed between the array substrate and the first inorganic layer and between the light emitting device layer and the first inorganic layer.

20. The display panel according to claim 17, wherein:
the at least one first adhesive layer is disposed on a side of the encapsulation layer away from the array substrate.

* * * * *